United States Patent [19]

Blossfeld

[11] Patent Number: 4,503,603

[45] Date of Patent: Mar. 12, 1985

[54] PROCESS FOR MANUFACTURING A MONOLITHIC INTEGRATED SOLID-STATE CIRCUIT HAVING AT LEAST ONE INSULATED-GATE FIELD-EFFECT TRANSISTOR AND AT LEAST ONE BIPOLAR TRANSISTOR

[75] Inventor: Lother Blossfeld, Freiburg-Hochdorf, Fed. Rep. of Germany

[73] Assignee: ITT Industries, Inc., New York, N.Y.

[21] Appl. No.: 492,459

[22] Filed: May 5, 1983

[30] Foreign Application Priority Data

May 6, 1982 [EP] European Pat. Off. ........ 82103910.4

[51] Int. Cl.³ ................. H01L 21/225; H01L 21/265; H01L 27/04
[52] U.S. Cl. .................................... 29/571; 29/576 B; 29/577 C; 148/1.5; 148/187; 357/43; 357/91
[58] Field of Search ................ 29/571, 576 B, 577 C; 148/1.5, 187; 357/43, 91

[56] References Cited

U.S. PATENT DOCUMENTS

| 4,231,051 | 10/1980 | Custode et al. ................. 29/577 C |
| 4,295,266 | 10/1981 | Hsu ........................ 29/571 |
| 4,311,532 | 1/1982 | Taylor ................... 148/1.5 |
| 4,314,267 | 2/1982 | Bergeron et al. .............. 357/91 |
| 4,325,180 | 4/1982 | Curran ................... 29/571 |
| 4,362,574 | 12/1982 | Gevondyan .................. 148/1.5 |
| 4,373,253 | 2/1983 | Khadder et al. ............... 29/576 B |

OTHER PUBLICATIONS

Dorler et al., IBM-TDB, 24, (1981), 466.
Ma et al., IBM-TDB, 16, (1973), 2287.
Antipov, IBM-TDB, 18, (1975), 1401.
Chang et al., IBM-TDB, 24, (1982), 5571.

*Primary Examiner*—Upendra Roy
*Attorney, Agent, or Firm*—Donald J. Lenkszus

[57] ABSTRACT

This invention provides a process for manufacturing a monolithic integrated solid-state circuit comprising at least one bipolar transistor (npn) and at least insulated-gate field-effect transistor (PMOS), in which the dopings of the regions (zones) (1, 4, 8; 2, 5, 6; 15, 16) are introduced into the one surface side of a semiconducting substrate (3) by employing photoresist masks and by way of ion implantation. Moreover, the process according to the invention makes use of an oxidation masking layer with a topmost disposed nitride layer, with the thickness and the composition thereof, either with or without the nitride layer, corresponding to the gate insulator layer. Parts of the oxidation masking layer are used as a masking for two ion implantation processes performed with different doses and energies during the implantation of dopings of the base region, while other parts of the oxidation masking layer serve as a stopping layer during the etching of the contact openings of the gate electrode down to the nitride layer through a foreign oxide layer (13), under which the implanted ions are activated at an increased temperature.

4 Claims, 10 Drawing Figures

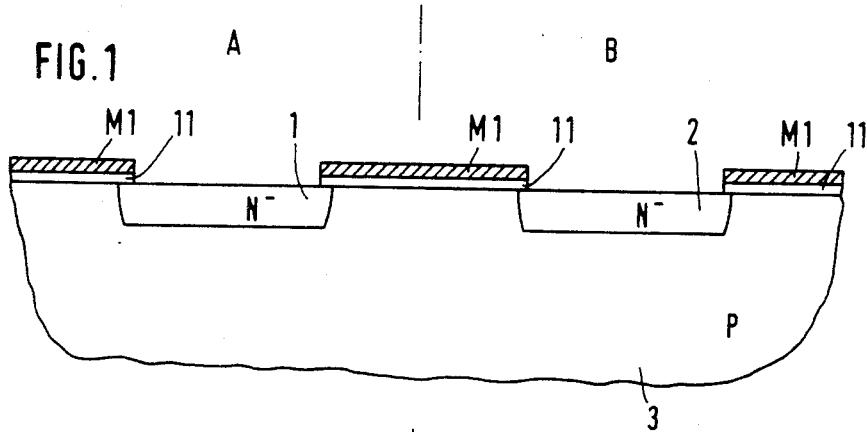
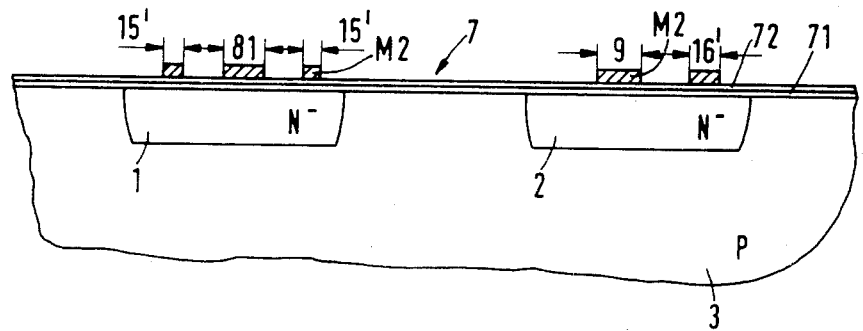
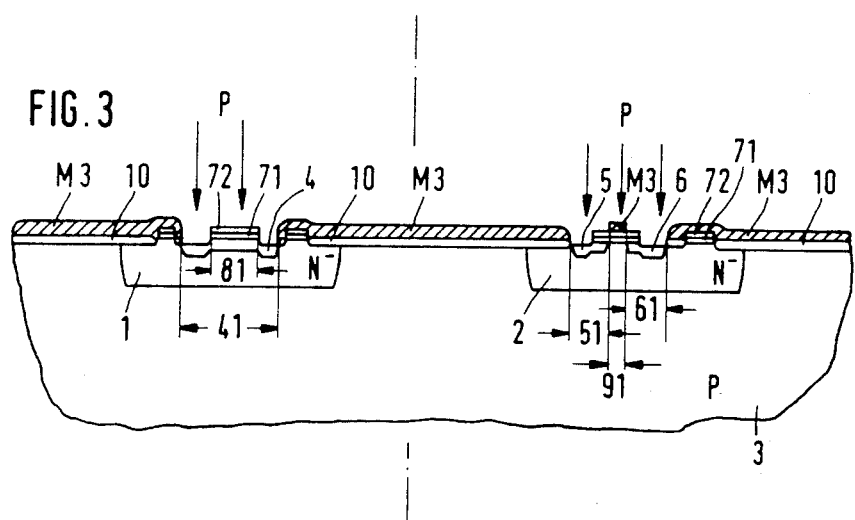

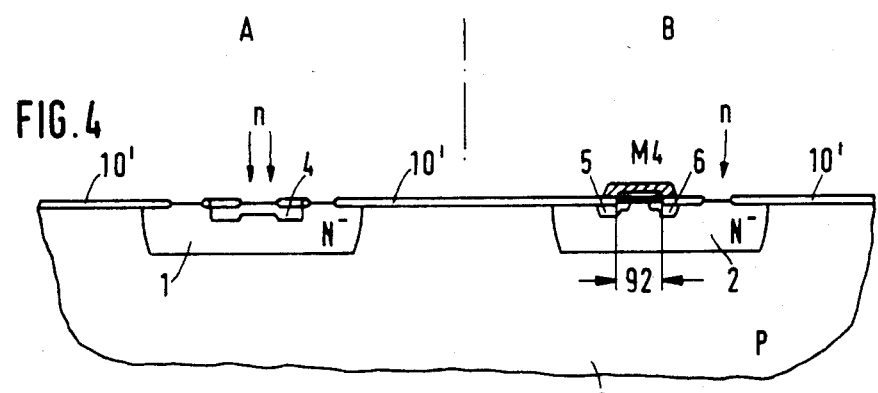
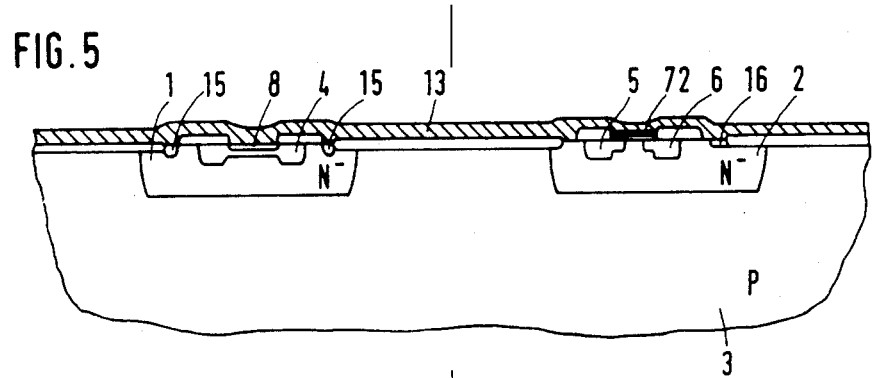
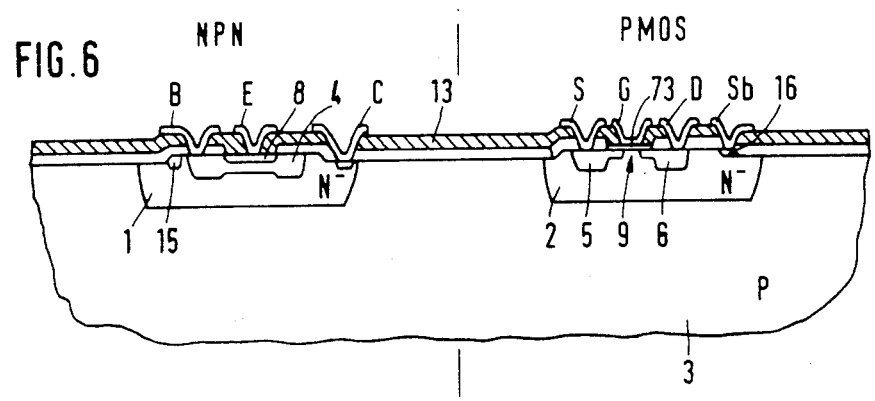

PROCESS FOR MANUFACTURING A MONOLITHIC INTEGRATED SOLID-STATE CIRCUIT HAVING AT LEAST ONE INSULATED-GATE FIELD-EFFECT TRANSISTOR AND AT LEAST ONE BIPOLAR TRANSISTOR

BACKGROUND OF THE INVENTION

From the book by J. E. Carroll "Solid State Devices" (1980), pages 114 to 117 there is known a process of manufacturing a planar monolithic integrated solid-state circuit comprising at least one insulated-gate field-effect transistor and at least one bipolar transistor whose regions are each implanted in a substrate region of the first conductivity type on the one surface side of a semiconducting substrate of silicon of the second conductivity type. In this process, by means of masked implantations of ions of the corresponding conductivity type, the dopings of the base region and of the emitter region of the bipolar transistor are brought into the first substrate region and those of the source region and of the drain region of the insulated-gate field-effect transistor into the other substrate region, and diffused therein by being activated.

The invention is an improvement on such a process.

The bipolar transistor of the monolithic integrated solid-state circuit manufactured in accordance with the known process, has the disadvantages of an emitter region not centered automatically in relation to the base region, and of a compensated emitter region, so that only relatively small current gain values and low cutoff frequencies are realizable in practice. A non-compensated emitter, according to "Technical Digest IEDM" 1979, pages 514 to 516, in fact offers the advantage that relatively high current-gain values and increased cut off frequencies are realizable in practice. Another disadvantage of the bipolar transistor manufactured in accordance with the known process, is based on a relatively high base resistance as a consequence of an unfavourable distribution of the base region doping which, in turn, has an unfavourable influence upon the cutoff frequency. Finally, the known process according to the aforementioned passage of literature, has the disadvantage that up to the point of manufacturing the electrodes and lead-in conductors of the bipolar transistor, three photoresist making processes are required.

SUMMARY OF THE INVENTION

It is the object of the invention, therefore, to provide a process permitting the manufacture of a monolithic integrated solid-state circuit of the type involved having at least one bipolar transistor of relatively high current gain and a high cutoff frequency, and at least one field-effect transistor, by employing as few as possible photoresist processes.

According to the invention, this object is achieved by depositing a masking layer which includes a first insulator layer and a second upper nitride layer. A portion of the insulator layer alone or in combination with the nitride layer is utilized as the gate oxide layer of the field-effect transistor, which is automatically correctly positioned since it remains through all the processing steps. A corresponding portion of the nitride layer is utilized as the stopping layer for the foreign oxide etching process to protect the gate oxide layer during the oxide etch. Portions of the masking layer are utilized as masks for ion implantation steps.

BRIEF DESCRIPTION OF THE DRAWINGS

The features and advantages of the process according to the invention will now be explained hereinafter with reference to the accompanying drawings in which FIGS. 1 to 6 illustrate partial cross sectional views taken through a plate-shaped semiconductor body in which a bipolar npn planar transistor and a p-channel field-effect transistor are manufactured in accordance with the inventive process, and FIGS. 3a to 6a illustrate a further embodiment of the process according to the invention, relating to the manufacture of planar integrated solid-state circuits comprising insulated-gate field-effect transistors of different channel conductivity types.

DESCRIPTION OF THE PREFERRED EMBODIMENTS

Figure 3A:
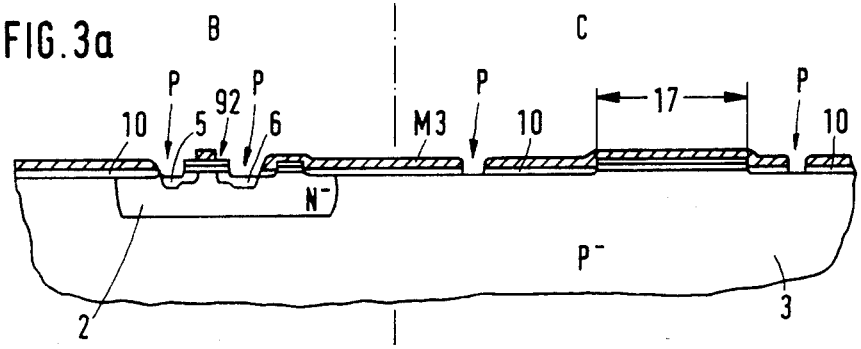

FIGS. 1 to 6, partly in the usual cross sectional representation and almost perpendicular in relation to the one surface side of a semiconducting substrate of silicon, show under A successively following stages in manufacturing an npn bipolar transistor and, under B, the associated stages in manufacturing a PMOS field-effect transistor. Of course, also the opposite conductivity types can be used; with a view of a rapid switch behaviour, however, npn bipolar transistors and p-channel MOS field-effect transistors are preferred, especially when the latter are merely intended to be used as current sources and load resistors.

At the time position of manufacturing as shown in FIG. 1, there is obtained a substrate body 3 into the one surface side of which, in the conventional way by employing a masked ion implantation process, the dopings of the substrate regions 1 and 2 have been inserted and infused. To use the process of ion implantation for this purpose is advisable with a view to the adjustment of the field threshold voltage of the field-effect transistor. It is also possible to employ further masked ion implantations for adjusting the field threshold voltage or also of the type of field-effect transistor in accordance with the first mentioned passage of literature.

According to the prior art, and by employing a first photoresist mask M1, there are at first produced the two substrate regions 1 and 2, in that preferably the dopings of the regions are inserted by way of ion implantation into the semiconductor surface side. The photoresist mask M1 is peeled off, the dopings are diffused-in, and finally the oxide mask 11 is removed. Thereafter, the surface side is covered with an oxidation masking layer 7. This layer consists of a lower insulator partial layer 71 and of an upper nitride layer 72 of $Si_3N_4$ deposited thereon, with either the lower insulating layer 71 alone or together with the nitride layer 72 corresponding to the composition and thickness of the gate insulator layer of the field-effect transistor. Both layers together, when suitably dimensioned, can in fact be used as gate insulator partial layers of MNOS storage transistors in the integrated solid-state circuit.

It is essential with respect to the invention, however, that in any case the top layer is a layer of nitride, which may consist of $Si_3N_4$ because the latter, in the process according to the invention, is used as a stopper layer for the etching process of a foreign oxide layer 13 (cf. FIG. 6).

Onto the aforementioned sequence of layers topped by the nitride layer 72, for the purpose of restricting an etching process, there is now deposited the second photoresist mask M2 which covers the emitter area 81, a central area 9 above the gate area 91 as well as adjacent areas of the source region 5 to be manufactured, and of the drain region 6 to be manufactured, as well as the contacting areas 15' and 16' of the substrate region, as is illustrated in FIG. 2.

Thereafter, by employing a second photoresist mask M2 as the etching mask, and by means of a plasma etching process, the exposed parts of the oxidation masking layer 7 are removed by way of etching, down to the semiconductor surface, whereupon the second photoresist mask M2 is peeled off. The exposed parts of the surface side are then oxidized by forming the oxide layer 10.

After that, a third photoresist mask M3 is deposited for restricting an etching process and an ion implantation process. This photoresist mask M3 restricts and defines, together with the remaining parts of the oxidation masking layer 7, the base area 41, the source area 51, the drain area 61 and, consequently, also the gate area 91. The parts of the oxide layer not covered with photoresist, are now removed by way of etching, as is illustrated in FIG. 3.

In any arbitrary order of succession, there are now carried out two processes of implanting ions of the same conductivity type, of which the one is carried out at a relatively low accelerating energy and a relatively high dose and the other one at a relatively small dose and such a relatively high accelerating energy, that the oxidation masking layer 7 is being penetrated. In the course of this, as can be seen from FIG. 3, there is produced an external relatively thick base region portion 4 outside the emitter area 81 and a relatively thin base region portion within the emitter area 81. In this stage there is provided the basis for a bipolar transistor of a low base region lead-in resistance and a non-compensated emitter region. At the same time, and owing to the fact that the third photoresist mask M3 merely covers the gate area 91 and not the entire central area 9 (cf. FIG. 2) above the gate area 91, there are produced the doping areas with thin deposits, defining the gate area 91, which are already to be considered as the source region or the drain region 5 or 6 respectively.

Upon removal of both the third photoresist mask M3 and the oxide layer 10, there are oxidized the surface areas which are not protected against oxidation, in the course of which there results a new oxide layer 10' which is interrupted by the remaining portions of the oxidation masking layer, as is illustrated by FIG. 4. Now, there is deposited a fourth photoresist mask M4 covering the remaining portion 92 of the oxidation masking layer 7 within the central area 9 of the gate area 91 of the field-effect transistor. On the fourth photoresist mask M4 there does not need to be placed any demands as to special accuracy with regard to restriction and alignment, because the ion implantation process taking place after a following etching, will be restricted by the new oxide layer 10'.

Thereafter, by way of etching during the gas phase (plasma etching), there are removed those parts of the nitride layer 72 which are not covered by the fourth photoresist mask M4 and, thereafter, the portions of the insulator layer 71 lying therebeneath, as can be recognized from FIG. 3. Thereafter, the surface side of the arrangement is bombarded by doping ions of the conductivity type of the emitter region, for example, with arsenic ions, so that an arrangement as shown in FIG. 4 is obtained.

For the purpose of protecting the regions, in particular the rim portions thereof, and following the removal of the fourth photoresist mask M4, the foreign oxide layer 13 is deposited onto the entire arrangement, as shown in FIG. 5, whereupon the dopings under this foreign oxide layer 13 are activated at an increased temperature, in the course of which the dopings slightly diffuse into the semiconductor body. From this there are obtained the emitter region 8 and the collector contacting region 15 preferably surrounding the base region 4, as well as the contacting region 16 of the substrate region 2.

After that there is used a fifth photoresist mask which, as is well known, is required for exposing the contacting regions. This fifth mask, however, in the process according to the invention, additionally serves to expose the nitride layer 72 being the topmost layer in the gate area 91, so that when using an etching solution as commonly used for exposing the contacting regions, the etching process of the foreign oxide layer 13 comes to a standstill at the nitride layer 72. In this way there is obtained exactly the desired gate insulating layer of the insulated-gate field-effect transistor, because this was already given in the first place. Now the gate insulating layer 73 either alone or also in combination with the remaining portion of the nitride layer 72 may be used as the gate insulating layer. In the case of the sole use of the insulator partial layer arranged below the nitride layer 72, the nitride layer is removed selectively, preferably by employing a plasma etching process.

Finally, by employing a sixth photoresist mask, contacts B, E, C, S, D, provided in the known way with conductor leads, and the substrate contact Sb are attached to the regions 1, 4, 8, 6, 2, in the course of which, however, there is simultaneously manufactured the gate electrode (G) with the conductor lead thereof.

Accordingly, in the process according to the invention there are utilized in a special way the properties of oxidation masking layers topped by a silicon nitride layer, which have a masking effect against ion implantations and selective etching processes, with these being etched out of a uniform insulating layer which, at least in partial layers, is used as a gate insulating layer of an insulated-gate field-effect transistor.

In the process according to the invention there is in particular thought of the manufacture of monolithic integrated solid-state circuits having npn bipolar transistors and p-channel field-effect transistors which are used as load elements or current sources, with the high-frequency properties thereof being of subordinated importance, while for the bipolar transistors there are required optimum high frequency properties or the suitability for being used as high-speed switches. Of course, the process according to the invention can also be used for manufacturing monolithic integrated solid-state circuits employing transistors of the other conductivity type. However, the process according to the invention, and with a view to the integration of a p-channel field-effect transistor, may also be further embodied or modified in addition to the npn bipolar transistor. For this purpose, there is merely required an additional photoresist mask which serves to restrict an additional ion implantation process.

A further embodiment of the process according to the invention will now be explained hereinafter in detail with reference to FIGS. 3a through 6a. In these drawings, the part A of FIGS. 1 to 3 has been omitted, and adjacent to the part B there is shown the part C of the NMOS substrate transistor next to the PMOS substrate region transistor. In accordance with this embodiment, the process steps described above with respect to FIGS. 1 and 2 are first performed.

After this, however, there is deposited a second photoresist mask M2, which, additionally covers a surface area 17 of the substrate 3 which is sufficient for manufacturing the NMOS substrate transistor, as is illustrated in FIG. 3a.

Figure 4A:
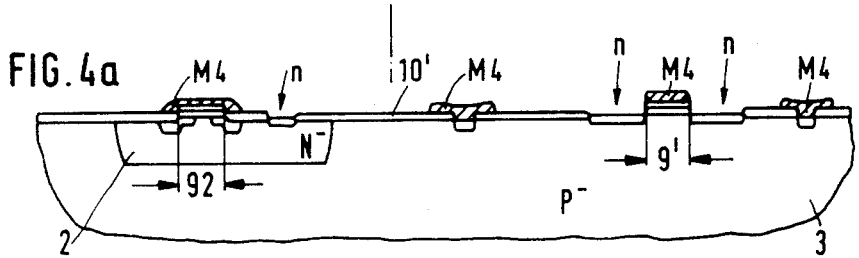

FIG. 4a shows the stage corresponding to that of FIG. 4. For this purpose, following the oxidation of the exposed surface side, there is formed the oxide layer 10 by way of thermal oxidation and a third photoresist mask M3 is deposited which additionally overlappingly covers the aforementioned surface area 17, whereupon those parts of the oxide layer 10 which are not coloured by the photoresist, are removed. Following the implantation of ions of the conductivity type of the substrate 3, as is denoted in FIG. 3a, and, following the removal of the third photoresist mask M3 and the oxide layer, as well as the formation of a new oxide layer 10', there is deposited a fourth photoresist mask M4 which covers the remaining portion 92 of the oxidation masking layer 7 of the PMOS field-effect transistor and a central portion 9' of the aforementioned surface area 17 above the gate area of the further NMOS substrate field-effect transistor. Accordingly, during the following etching from the gaseous phase, there is exposed on both sides of the central portion and towards the rim portions of the new oxide layer 10', each time one portion of the semiconductor surface, as is shown in FIG. 4a.

Figure 5A:
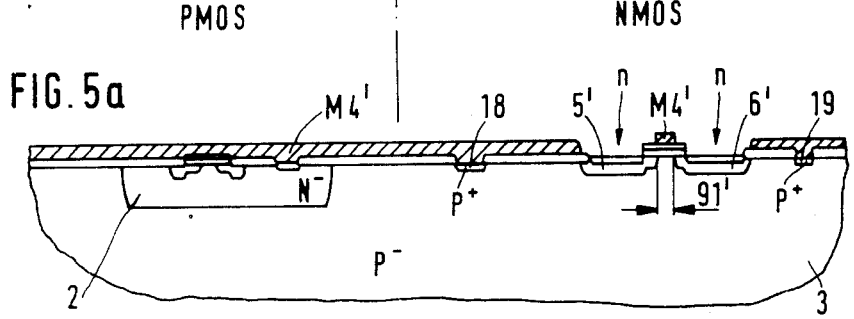
Figure 6A:
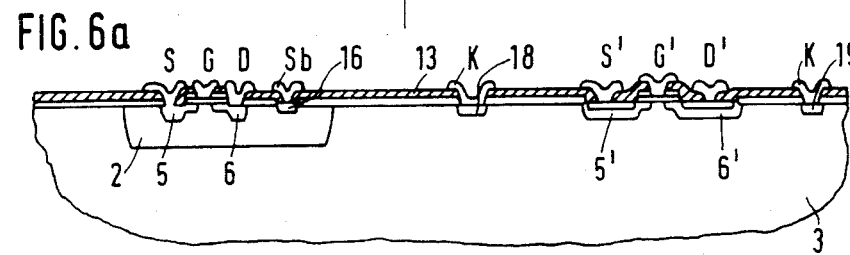

With reference to FIG. 5a which does not correspond to the stage as shown in FIG. 5, there is described the deposition of a further photoresist mask M4' and the performance of a further implantation process which is required in addition to the processing measures already explained hereinbefore with reference to FIGS. 1 to 6. In fact, following the already mentioned implantation of ions of the conductivity type of the emitter region of the bipolar transistor, and the removal of the fourth photoresist mask M4, there is deposited a further photoresist mask M4' as is shown in FIG. 5a, which covers the gate area 91' of the further field-effect transistor (NMOS) to be manufactured and at least those parts of the semiconductor surface not covered by the new oxide layer 10'. In a similar way as described with reference to FIG. 3, there is now effected a bombardment of the surface side of the arrangement as shown in FIG. 5a, with further ions of the conductivity type of the emitter region with such an accelerating energy that, in fact, the oxidation masking layer is penetrated but not the one reinforced by the photoresist mask M4'. Accordingly, there is obtained a field-effect transistor having the regions 5' and 6' which, just like the PMOS field-effect transistor as shown in FIG. 6, which have extensions restricting the gate area 91'.

After that there is proceeded in the same way as has already been described hereinbefore with reference to FIGS. 5 and 6. Hence, upon removal of the further photoresist mask M4' the dopings implanted as ions, are activated underneath a foreign oxide layer 13 as deposited onto the surface of the arrangement, at an increased temperature, thus causing a slight diffusion. The fifth photoresist mask just like the sixth photoresist mask, is provided with additional openings as required for exposing the regions to be contacted and the topmost nitride layer. Together with the gate electrode G there is produced the gate electrode G' of the NMOS field-effect transistor, during which again as a stopper layer there is used the topmost nitride layer 72 during the etching through of the foreign oxide layer 13. Again, the topmost nitride layer 72 can be removed from the oxide layer lying thereheneath in the course of a selective etching process prior to the manufacture of the gate electrodes.

The fifth just like the sixth photoresist mask may contain openings which are used for contacting the substrate contacting regions 18 ansd 19 via conductor leads. The doping of these substrate contacting regions 18, 19 is effected in the ion implantation process as described with reference to FIG. 3a, with ions of the conductivity type of the substrate 3, for which purpose in the third photoresist mask M3 there are provided openings as shown in FIG. 3a. The areas of these openings are to be covered by means of the fourth photoresist mask M4 as is illustrated in FIG. 4a.

I claim:

1. In a process for manufacturing a planar monolithic integrated solid-state circuit which includes at least one insulated-gate field-effect transistor and at least one bipolar transistor, each of the transistors having a doped substrate region of a first conductivity type formed in a silicon substrate surface portion of a second conductivity type, the improvement comprising the steps of:

forming a masking layer over the substrate surface portion including the transistor substrate regions by forming a first insulator layer on said substrate surface portion and a second upper nitride layer on said insulator layer, and forming at least said insulator layer of a composition and thickness to form the gate insulator layer of the field-effect transistor;

forming a mask over portions of said masking layer to mask at least the emitter and contact areas of the bipolar transistor and the gate area, adjacent source and drain regions and the contact area of the field-effect transistor;

removing the exposed portions of the masking layer which are not covered by the mask;

removing the mask from the masked portions of the masking layer;

forming a first oxide layer over the substrate surface portion, the transistor regions and the masking layer portions;

forming a mask over said first oxide layer to define the base area of the bipolar transistor and the source and drain areas of the field-effect transistor;

removing the first oxide layer over the defined transistor areas;

ion doping the base, source and drain regions including penetrating unmasked portions of said masking layer;

removing the remaining oxide mask;

forming a second oxide layer over the surface areas not having the masking layer thereon;

forming a mask over the masking layer above the gate region of the field-effect transistor;

removing the remaining unmasked portions of the masking layer;

ion doping the exposed transistor regions including at least the bipolar transistor emitter region;

removing the masking layer mask;

forming a foreign oxide layer;

activating the implanted doping;

forming a mask on the foreign oxide layer to define the transistor contact areas and said gate region masking layer;

removing the oxide layer over said contact areas and said gate region masking layer; and forming the contacts and conductor leads as well as the gate electrode and corresponding lead thereof.

2. The process as defined in claim 1 including:

removing said nitride layer from the exposed gate region masking layer prior to forming said gate electrode.

3. The process as defined in claim 1 including:

forming said mask over said masking layer to include a second NMOS field-effect transistor region;

forming said mask over said first oxide layer to define said NMOS transistor contact region;

removing said first oxide layer to include over the defined contact regions;

ion doping to include said contact regions;

forming said mask over the masking layer to include a central gate portion of said NMOS transistor;

ion doping said regions to include ion doping the exposed region of said NMOS transistor;

prior to forming said foreign oxide layer, forming an additional mask over the gate areas of said NMOS transistor, to expose the source and drain regions and adjacent portions of said gate area, ion doping said exposed portions including penetrating said exposed gate area portions and removing said additional mask;

forming said foreign oxide mask to define the NMOS transistor contact areas and gate region masking layer;

removing said oxide layer to include said NMOS transistor contact areas and gate region masking layer; and forming said contacts and leads to include the NMOS transistor contacts and conductor leads as well as the gate electrode and corresponding lead thereof.

4. The process as defined in claim 3 including:

removing said nitride layer from the exposed gate region masking layer prior to forming said gate electrode.

* * * * *